(12) United States Patent
Bulović et al.

(10) Patent No.: US 7,700,200 B2
(45) Date of Patent: Apr. 20, 2010

(54) LIGHT EMITTING DEVICE INCLUDING SEMICONDUCTOR NANOCRYSTALS

(75) Inventors: Vladimir Bulović, Lexington, MA (US); Seth A. Coe, Watertown, MA (US); Wing-Keung Woo, Cambridge, MA (US); Moungi G. Bawendi, Boston, MA (US)

(73) Assignees: Massachusetts Institute of Technology, Cambridge, MA (US); Universal Display Corporation, Ewing, NJ (US)

( * ) Notice: Subject to any disclaimer, the term of this patent is extended or adjusted under 35 U.S.C. 154(b) by 455 days.

(21) Appl. No.: 10/400,908

(22) Filed: Mar. 28, 2003

(65) Prior Publication Data
US 2004/0023010 A1 Feb. 5, 2004

Related U.S. Application Data

(60) Provisional application No. 60/368,130, filed on Mar. 29, 2002.

(51) Int. Cl.
*H01L 51/50* (2006.01)
*H05B 33/12* (2006.01)

(52) U.S. Cl. .................. 428/690; 428/403; 428/917; 313/502; 313/503; 313/506; 257/89; 257/103; 427/66; 427/68; 427/71; 977/774; 977/813; 977/952

(58) Field of Classification Search .............. None
See application file for complete search history.

(56) References Cited

U.S. PATENT DOCUMENTS

| | | | | |
|---|---|---|---|---|
| 5,260,957 | A | 11/1993 | Hakimi et al. ............ 372/39 |
| 5,293,050 | A | 3/1994 | Chapple-Sokol et al. ...... 257/17 |
| 5,354,707 | A | 10/1994 | Chapple-Sokol et al. ..... 437/106 |
| 5,422,489 | A | 6/1995 | Bhargava ................. 250/488.1 |
| 5,505,928 | A | 4/1996 | Alivisatos et al. ........... 423/299 |
| 5,525,377 | A | 6/1996 | Gallagher et al. ........... 427/512 |
| 5,537,000 | A | 7/1996 | Alivisatos et al. ........... 313/506 |
| 5,585,640 | A | 12/1996 | Huston et al. ............. 250/483.1 |
| 5,613,140 | A | 3/1997 | Taira ......................... 395/800 |
| 5,677,545 | A | 10/1997 | Shi et al. ..................... 257/40 |
| 5,751,018 | A | 5/1998 | Alivisatos et al. ............ 257/64 |
| 5,958,573 | A * | 9/1999 | Spitler et al. ................ 428/323 |
| 6,103,868 | A | 8/2000 | Heath et al. ................. 528/402 |
| 6,157,047 | A | 12/2000 | Fujita et al. .................... 257/51 |
| 6,207,229 | B1 | 3/2001 | Bawendi et al. ............ 427/215 |
| 6,236,060 | B1 * | 5/2001 | Chan et al. .................... 257/13 |
| 6,294,401 | B1 | 9/2001 | Jacobson et al. .............. 438/99 |
| 6,322,901 | B1 | 11/2001 | Bawendi et al. ............. 428/548 |
| 6,379,635 | B2 | 4/2002 | O'Brien et al. ............... 423/87 |
| 6,447,698 | B1 | 9/2002 | Ihara et al. ............. 252/301.36 |
| 6,501,091 | B1 | 12/2002 | Bawendi et al. ............... 257/14 |
| 6,576,291 | B2 | 6/2003 | Bawendi et al. ............. 427/215 |
| 6,607,829 | B1 | 8/2003 | Bawendi et al. ............. 428/403 |
| 6,797,412 | B1 | 9/2004 | Jain et al. ................... 428/690 |
| 6,803,719 | B1 * | 10/2004 | Miller et al. ................ 313/501 |
| 6,846,565 | B2 | 1/2005 | Korgel et al. ............... 428/402 |
| 6,864,626 | B1 | 3/2005 | Weiss et al. ................. 313/503 |
| 2001/0005495 | A1 | 6/2001 | O'Brien et al. ............... 423/87 |
| 2003/0017264 | A1 | 1/2003 | Treadway et al. ............ 427/212 |
| 2003/0042850 | A1 | 3/2003 | Bertram et al. ............. 313/504 |
| 2004/0265622 | A1 | 12/2004 | Sadasivan et al. ........... 428/690 |

FOREIGN PATENT DOCUMENTS

| | | |
|---|---|---|
| JP | A-2001-279240 | 10/2001 |
| WO | WO9610282 | 4/1996 |
| WO | WO 97/10175 | 3/1997 |
| WO | WO 99/26299 | 5/1999 |
| WO | WO 03/021694 | 3/2003 |
| WO | WO 2005004253 | 1/2005 |
| WO | WO 2005017951 | 2/2005 |

OTHER PUBLICATIONS

Alivisatos, "Perspectives on the Physical Chemistry of Semiconductor Nanocrystals," J. Phys. Chem. 1996(100):13226-13239, 1996.

Colvin, et al., "Light-emitting diodes made from cadmium selenide nanocrystals and a semiconducting polymer," Nature 370(6488):354-357, Aug. 4, 1994.

Dabbousi, et al., "(CdSe)ZnS core-shell quantum dots: synthesis and characterization of a size series of highly luminescent nanocrystallites," J. Phys. Chem. B 101(46):9463-9475, Nov. 13, 1997.

Dabbousi, et al., "Electroluminescence from CdSe quantum-dot/polymer composites," Appl. Phys. Lett. 66(11):1316-1318, Mar. 13, 1995.

Danek, et al., "Synthesis of Luminescent Thin-Film CdSe/ZnSe Quantum Dot Composites Using CdSe Quantum Dots Passivated with an Overlayer of ZnSe," Chem. Mater. 8(1):173-180, 1996.

Diehl, "Fraunhofer LUCOLEDs to replace lamps," III-Vs Rev. 10(1), 1997, p. 4.

(Continued)

*Primary Examiner*—Marie R. Yamnitzky
(74) *Attorney, Agent, or Firm*—Steptoe & Johnson LLP

(57) ABSTRACT

A light emitting device includes a semiconductor nanocrystal in a layer. The layer can be a non-polymeric layer.

77 Claims, 13 Drawing Sheets

OTHER PUBLICATIONS

Empedocles, et al., "Photoluminescence Spectroscopy of Single CdSe Nanocrystallite Quantum Dots," Phys. Rev. Lett. 77(18):3873-3876, Oct. 1996.

Empedocles, et al., "Quantum-Confined Stark Effect in Single CdSe Nanocrystallite Quantum Dots," Science 278:2114-2117, Dec. 1997.

Guha, et al., "Hybrid organic-inorganic semiconductor-based light-emitting diodes," J. Appl. Phys. 82(8):4126-4128, Oct. 15, 1997.

Hines, et al., "Synthesis and Characterization of Strongly Luminescing ZnS-Capped CdSe Nanocrystals," J. Phys. Chem. 100:468-471, Jan. 1996.

Kagan, et al., "Electronic Energy Transfer in CdSe Quantum Dot Solids," Phys. Rev. Lett. 76(9): 1517-1520, Feb. 1996.

Kagan, et al. "Long-range resonance trasfer of electronic excitations in close-packed CdSe quantum-dot solids," Phys. Rev. B 54(12):8633-8643, Sep. 1996.

Kortan, et al., "Nucleation and Growth of CdSe on ZnS Quantum Crystallite Seeds, and Vice Versa, in Inverse Micelle Media," J. Am. Chem. Soc. 112:1327-1332, 1990.

Kuno, et al., "The band edge luminescence of surface modified CdSe nanocrystallites: Probing the luminescing state," J. Chem. Phys. 106(23):9869-9882, Jun. 1997.

Lawless, et al., "Bifunctional Capping of CdS Nanoparticles and Bridging to TiO2," J. Phys. Chem. 99:10329-10335, 1995.

Leatherdale, et al., "Photoconductivity in CdSe quantum dot solids", Phys. Rev. B, vol. 62, No. 4, pp. 2669-2680, (Jul. 15, 2000).

Matsumoto, et al., "Preparation of Monodisperse CdS Nanocrystals by Size Selective Photocorrosion," J. Phys. Chem 100(32):13781-13785, 1996.

Mattoussi et al., "Electroluminescence from heterostructures of poly(phenylene vinylene) and inorganic CdSe nanocrystals," J. Appl. Phys. 83(12):7965-7974, 1998.

Murray, et al., "Synthesis and Characterization of Nearly Monodisperse CdE(E=S, Se, Te) Semiconductor Nanocrystallites," J. Am. Chem. Soc. 115(19):8706-8715, 1993.

Nirmal, et al., "Fluorescence Intermittency in single Cadmium Selenide Nanocrystals," Nature 383:802-804, Oct. 1996.

Schlamp et al., "Improved efficiencies in light emitting diodes made with CdSe(CdS) core/shell type nanocrystals and a semiconducting polymer", J. Appl. Phys 82(11):5837-5842, 1997.

Spanhel et al., "Photochemistry of Colloidal Semiconductors. Surface Modification and Stability of Strong Luminescing CdS Particles", J. Am. Chem. Soc., 109 (19), pp. 5649-5655, (1987).

Bhargava et al., "Quantum Confined Atoms of Doped ZnO Nanocrystals", *Phys. Stat. Sol* (b) 229, No. 2, 897-901 (2002).

Sirenko et al., "Spin-flip and acoustic-phonon Raman scattering in CdS nanocrystals", *Physical Review B*, vol. 58, No. 4, (Jul. 15, 1998-II), 2077-2087.

Lublinskaya et al., "CdS nanocrystal growth in thin silica films: evolution of size distribution function", *Journal of Crystal Growth* 184/185 (1998) 360-364.

Valenta et al., "Dynamics of excitons in CuBr nanocrystals: Spectral-hole burning and transient four-wave-mixing measurements," *Physical Review B*, vol. 57, No. 3, Jan. 15, 1998-I, 1774-1783.

Saviot et al., "Size-selective resonant Raman scattering in CdS doped glasses," *Physical Review B*, vol. 57, No. 1, Jan. 1, 1998-I, 341-346.

Ekimov, A.I. "Growth and optical properties of semiconductor nanocrystals in a glass matrix," *Journal of Luminescence* 70 (1996) 1-20.

Saviot et al., "Size dependence of acoustic and optical vibrational modes of CdSe nanocrystals in glasses," *Journal of Non-Crystalline Solids* 197 (1996) 238-246.

Itoh et al., "Subpicosecond dynamics of confined excitons in CuCl nanocrystals," *Materials Science and Engineering* A217/218 (1996) 167-170.

Chamarro et al., "Enhancement of electron-hole exchange interaction in CdSe nanocrystals; A quantum confinement effect," *Physical Review B*, vol. 53, No. 3, Jan. 15, 1996-I, 1336-1342.

Edamatsu et al., "Subpicosecond dynamics of confined excitons and optical nonlinearities of CuCl quantum dots," *Journal of Luminescence* 66 & 67 (1996) 406-409.

Chamarro et al., "Size-dependent Electron-Hole Exchange Interaction in CdSe Quantum Dots," *Il Nuovo Cimento*, vol. 17, Nos. 11-12, (1995) 1407-1412.

Itoh et al., "Polaron and Exciton-Phonon Complexes in CuCl Nanocrystals," *Physical Review Letters*, vol. 74, No. 9, Feb. 27, 1995, p. 1645-1648.

Ekimov, A.I. et al., "Growth of CdSe nanocrystals in ion-implanted-$SiO_2$ films," *Journal of Crystal Growth* 151 (1995) 38-45.

Saviot et al., "Effects of Resonance on Low-Frequency Raman Scattering From Semiconductor Nanocrystals," *Radiation Effects and Defects in Solids*, 1995, vol. 137, pp. 45-50.

Ekimov, A.I., "Optical Properties of Oxide Glasses Doped by Semiconductor Nanocrystals," *Radiation Effects and Defects in Solids*, 1995, vol. 134, pp. 11-22.

Chamarro et al., "Enhancement of Exciton Exchange Interaction by Quantum Confinement in CdSe Nanocrystals," Jpn. J. Appl. Phys., vol. 34, 12-14 (1994).

Gurevich et al., "Growth of CdS nanocrystals in silicate glasses and in thin $SIO_2$ films in the Initial states of the phase separation of a solid solution," *Semiconductors*, 28 (5), May 1994, 486-493.

Itoh et al., "Interface effects on the properties of confined excitons in CuCl microcrystals," *Journal of Luminescence* 60 & 61 (1994) 396-399.

Jursenas et al. "Surface Recombination of Nonequilibrium Electron-Hole Plasma in Laser-Modified Semiconductor-Doped Glasses," *Solid State Communications*, vol. 87, No. 6, 577-580 (1993).

Tamulaitis et al., "Dynamics of Nonlinear Optical Response of CuBr-Doped Glasses," *Superlattices and Microstructures*, vol. 13, No. 2, 199-202 (1993).

Ekimov, A. I. et al., "Absorption and intensity-dependent photoluminescence measurements on CdSe quantum dots: assignment of the first electronic transitions," *Journal of the Optical Society of America*, vol. 10, Nos. 1-12, 100-107 (1993).

Gurevich et al. "Preparation and investigation of $SIO_2$ films activated by CdS semiconductor nanocrystals," *Soviet Physics Semiconductors*, vol. 26, 57-59 (1992).

Aktsipetrov et al. "Generation of reflected second harmonic at semiconductor quantum dots," *JETP Letters*, vol. 55, No. 8, 435-439 (1992).

Ekimov, A.I. et al. "Dimensional Effects in Luminescence Spectra of Zero-Dimensional Semiconductor Structures," *Bulletin of the Russian Academy of Sciences*, vol. 56, No. 2, pp. 154-157, Feb. 1992.

Baltrameyunas et al., "Fast switching of the transmission of light by glasses activated with CdS microcrystals," *Sov. Phys. Semicond.*, vol. 25 No. 2, 164-166 (1991).

Elfros et al., "Resonance Raman Spectroscopy of Electron-Hole Pairs—Polar Phonon Coupling in Semiconductor Quantum Microcrystals," *Solid State Communications*, vol. 78, No. 10, pp. 853-856, 1991.

Ekimov, A.I. et al., "Optics of Zero Dimensional Semiconductor Systems, *Acta Physica Polonica A*," vol. 79 (1991), No. 1. pp. 5-14.

Ekimov, A.I. "Optical Properties of Semiconductor Quantum Dots in Glass Matrix," *Physica Scripta*. vol. T39, 217-222 (1991).

Baltramiejunas et al. "Rapid Processes of Darkening and Bleaching in CdS Doped Glasses," *Superlattices and Microstructures* vol. 10, No. 3, 307-310 (1991).

Chepic et al., "Auger ionization of semiconductor quantum drops in a glass matrix," *Journal of Luminescence* 47 (1990) 113-127 North-Holland.

Dneprovskii et al., "Time-Resolved Luminescence of CdSe Microcrystals," *Solid State Communications*, vol. 74, No. 7, pp. 555-557, 1990.

Ekimov, A.I. et al., "Quantum-Size Stark Effect in Semiconductor Microcrystals," Journal of Luminescence 46 (1990) 97-100 North-Holland.

Ekimov, A.I. et al., "Spectra and Decay Kinetics of Radiative Recombination in CdS Microcrystals," *Journal of Luminescence* 46 (1990) 83-95 North-Holland.

Ekimov, A.I. et al., "Influence of high hydrostatic pressures on the exciton spectrum of CdS microcrystals in glass," *Sov. Phys. Semicond.* 23(9), Sep. 1989, pp. 965-966.

Ekimov, A.I. et al., "Photoluminescence of quasizero-dimensional semiconductor structures," *Sov. Phys. Solid State* 31(8), Aug. 1989, pp. 1385-1393.

Grabovskis et al., "Photoionization of semiconducting microcrystals in glass," *Sov. Phys. Solid State* 31(1), Jan. 1989, pp. 149-151.

Ekimov, A.I. et al., "Donor-like Exciton in Zero-Dimension Semiconductor Structures," *Solid State Communications*, vol. 69, No. 5, pp. 565-568, 1989.

Ekimov, A.I. et al., "Nonlinear Optics of Semiconductor-Doped Glasses," *Phys. Stat. Sol.* (b) 150, (1988) pp. 627-633.

Vandyshev et al., "Nonlinear optical properties of semiconductor microcrystals," *JETP Lett.*, vol. 46, No. 10, Nov. 25, 1987 pp. 495-499.

Ekimov, A.I. et al., "Quantization of the energy spectrum of holes in the adiabatic potential of the electron," *JETP Lett.*, vol. 43, No. 6, Mar. 25, 1986, pp. 376-379.

Ekimov, A.I. et al., "Quantum Size Effect in Semiconductor Microcrystals," *Solid State Communications*, vol. 56, No. 11, pp. 921-924, 1985.

Ekimov, A.I. et al., "Size quantization of the electron energy spectrum in a microscopic semiconductor crystal," *JETP Lett.*, vol. 40, No. 8, Oct. 25, 1984, pp. 1136-1139.

Ekimov, A.I. et al., "Quantum size effect in the optical spectra of semiconductor microcrystals," *Sov. Phys. Semicond.* 16(7), Jul. 1982, pp. 775-778.

Ekimov, A.I. et al., "Quantum size effect in three-dimensional microscopic semiconductor crystals," *JETP Lett*, vol. 34, No. 6, Sep. 20, 1981, pp. 345-349.

Volkov et al., "Oscillations of polarization of recombination radiation of a variable gap semiconductor in a magnetic field," *JETP Lett.*, vol. 25 No. 12, 526-528 (1977).

H. Mattoussi, et al., "Composite thin films of CdSe nanocrytals and a surface passivating/electron transporting block copolymer: Correlations between film microstructure by transmission electron microscopy and electroluminescence," *J. App. Phys.* 86:4390-4399 (1999).

\* cited by examiner

LIGHT EMITTING DEVICE INCLUDING SEMICONDUCTOR NANOCRYSTALS

CLAIM OF PRIORITY

This application claims priority under 35 USC §119(e) to U.S. Patent Application Ser. No. 60/368,130, filed on Mar. 29, 2002, the entire contents of which are hereby incorporated by reference.

FEDERALLY SPONSORED RESEARCH OR DEVELOPMENT

The U.S. Government may have certain rights in this invention pursuant to Grant No. DMR-9808941 from the National Science Foundation.

TECHNICAL FIELD

The present invention relates to light emitting devices including semiconductor nanocrystals.

BACKGROUND

Light-emitting devices can be used, for example, in displays (e.g., flat-panel displays), screens (e.g., computer screens), and other items that require illumination. Accordingly, the brightness of the light-emitting device is one important feature of the device. Also, low operating voltages and high efficiencies can improve the viability of producing emissive devices.

Light-emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

SUMMARY

In general, a light emitting device includes a plurality of semiconductor nanocrystals. Semiconductor nanocrystals consist of 1-10 nm diameter inorganic semiconductor particles decorated with a layer of organic ligands. These zero-dimensional semiconductor structures show strong quantum confinement effects that can be harnessed in designing bottom-up chemical approaches to create complex heterostructures with electronic and optical properties that are tunable with the size of the nanocrystals. The light emitting device can include a layer of a matrix. The matrix can be non-polymeric, for example, a small molecule. The light emitting device can include a first electrode proximate to a surface of the layer. A second layer can contact the layer. A second electrode can be proximate to the second layer. The semiconductor nanocrystal can have a CdSe core and a ZnS shell.

In one aspect, a light emitting device includes a first electrode, a layer including a in a matrix, a first electrode, a second electrode opposed to the first electrode and a plurality of semiconductor nanocrystals disposed between the first electrode and the second electrode. The electrodes can be arranged to apply a voltage drop across the layer.

In another aspect, a light emitting device includes a hole transporting layer proximate to a first electrode arranged to introduce holes in the hole transporting layer, an electron transporting layer proximate to a second electrode arranged to introduce electrons in the electron transporting layer, a plurality of semiconductor nanocrystals disposed between the first electrode and the second electrode, and a blocking layer between the first electrode and the second electrode. The blocking layer can be a hole blocking layer, an electron blocking layer, or a hole and electron blocking layer. The blocking layer can be in contact with the first electrode or the second electrode.

In another aspect, a method of manufacturing a light emitting device includes depositing a matrix to form a layer, depositing a plurality of semiconductor nanocrystals over a first electrode, and placing a second electrode over the plurality of semiconductor nanocrystals.

In yet another aspect, a method of generating light includes providing a device including a first electrode, a second electrode, a layer including a matrix, and a plurality of semiconductor nanocrystals disposed between the first electrode and the second electrode, and applying a light-generating potential across the first electrode and the second electrode.

The matrix can be non-polymeric. A non-polymeric material can have a molecular weight less than 2,000. The plurality of semiconductor nanocrystals can be a substantially monodisperse population of semiconductor nanocrystals, or more than one population.

The layer can be a hole transporting layer. The device can include an electron transporting layer, an electron blocking layer, a hole blocking layer, a hole and electron blocking layer, or combinations thereof between the first electrode and the hole transporting layer.

The light emitting device can have an external quantum efficiency of greater than 0.1%, greater than 0.2%, greater than 0.3%, greater than 0.4%, or greater than 0.6% at a current density of 7 $mA/cm^2$, or greater than 1.0% at a current density of 1 $mA/cm^2$. The light emitting device can have a device luminance of greater than 1000 $cd/m^2$, or between 1200 and 1500 $cd/m^2$ at a current density of 125 $mA/cm^2$. The device can have a luminescence efficiency of 1.2 cd/A. For example, the device can have a maximum emission wavelength of 570 nm and can have a full width at half maximum of 36 nm. The yield over hundreds of devices is greater than 90%.

Narrow size distribution, high quality nanocrystals with high fluorescence efficiency are first prepared using previously established literature procedures and used as the building blocks. See, C. B. Murray et al., J. Amer. Chem. Soc. 1993, 115, 8706, B. O. Dabbousi et al., J. Phys. Chem. B 1997, 101, 9463, each of which is incorporated by reference in its entirety. The organic, surface-passivating ligands are then exchanged to stabilize the nanocrystals in polar solvents and in the matrix.

The layer can include greater than 0.001%, greater than 0.01%, greater than 0.1%, greater than 1%, greater than 5%, greater than 10%, greater than 50%, or greater than 90% by volume semiconductor nanocrystals. A layer can be a monolayer of semiconductor nanocrystals. Each of the plurality of semiconductor nanocrystals includes a first semiconductor material. Each first semiconductor material can be overcoated with a same or different second semiconductor material. Each first semiconductor film has a first band gap and each second semiconductor material has a second band gap. The second band gap can be larger than the first band gap. Each nanocrystal can have a diameter of less than about 10 nanometers. The plurality of nanocrystals can have a monodisperse distribution of sizes.

There has been an increasing interest in light emitting devices based on organic materials, motivated in part by a wide range of applications, including flat panel displays. Advantageously, the emission frequencies of the light emitting devices including nanocrystals can be tuned without changing the structure of the device. Colloidal semiconductor nanocrystals exhibit size dependent optical properties due to strong quantum confinement effects. The emission colors of CdSe nanocrystals can vary from blue to red simply by changing their size. Their emission spectra can also show narrow Gaussian linewidths, which can be less than 30 nm. The addition of a shell of ZnS around CdSe cores results in overcoated nanocrystals that are highly stable, luminescent and can be dispersed in a range of organic environments. These features enhance the feasibility of using nanocrystals as the emitting material in light emitting devices.

Electrically pumped light emitting devices including nanocrystals as the electroluminescent material can be prepared in a controlled fabrication process environment which can enhance device lifetime. The tunability of the emission frequencies of the nanocrystals can allow multi-color flat panel displays to be prepared using them.

Other features, objects, and advantages of the invention will be apparent from the description and drawings, and from the claims.

DETAILED DESCRIPTION

A light emitting device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and hole localize on the same molecule, an exciton is formed, which can recombine to emit light.

Figure 1:
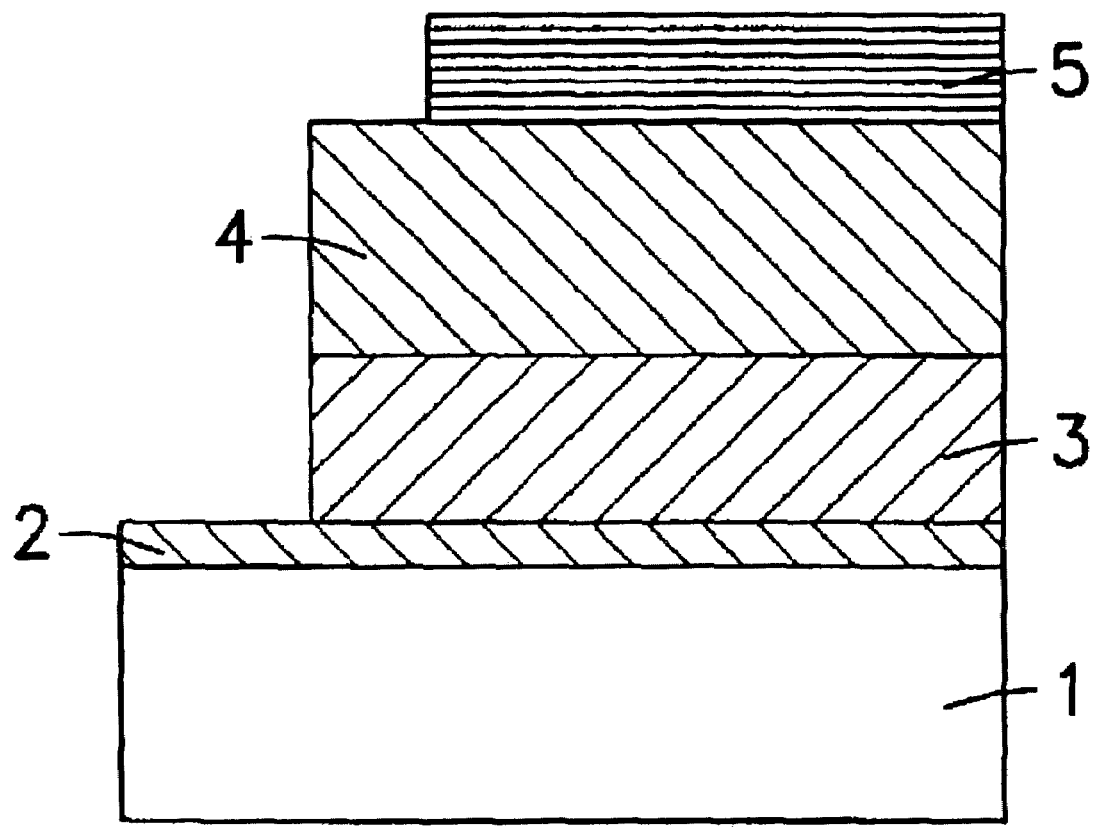
FIG. 1 is a schematic drawing depicting a light-emitting device.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 can be a hole transporting layer and second layer 4 can be an electron transporting layer. At least one layer can be non-polymeric. Alternatively, a separate emissive layer (not shown in FIG. 1) can be included between the hole transporting layer and the electron transporting layer. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure. First layer 3 can include a plurality of semiconductor nanocrystals, for example, a substantially monodisperse population of nanocrystals. Alternatively, a separate emissive layer can include the plurality of nanocrystals. A layer that includes nanocrystals can be a monolayer of nanocrystals.

The substrate can be opaque or transparent. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg:Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 1000 Angstroms. The separate emissive layer can have a thickness of about 50 Angstroms to about 200 Angstroms. The second layer can have a thickness of about 50 Angstroms to about 1000 Angstroms. The second electrode can have a thickness of about 50 Angstroms to greater than about 1000 Angstroms.

The electron transporting layer (ETL) can be a molecular matrix. The molecular matrix can be non-polymeric. The molecular matrix can include a small molecule, for example, a metal complex. For example, the metal complex can be a metal complex of 8-hydroxyquinoline. The metal complex of 8-hydroxyquinoline can be an aluminum, gallium, indium, zinc or magnesium complex, for example, aluminum tris(8-hydroxyquinoline) ($Alq_3$). Other classes of materials in the ETL can include metal thioxinoid compounds, oxadiazole metal chelates, triazoles, sexithiophene derivatives, pyrazine, and styrylanthracene derivatives. The hole transporting layer can include an organic chromophore. The organic chromophore can be a phenyl amine, such as, for example, N,N'-diphenyl-N,N'-bis(3-methylphenyl)-(1,1'-biphenyl)-4,4'-diamine (TPD). The HTL can include a polyaniline, a polypyrrole, a poly(phenylene vinylene), copper phthalocyanine, an aromatic tertiary amine or polynucluear aromatic tertiary amine, a 4,4'-bis(9-carbazolyl)-1,1'-biphenyl compound, or an N,N,N',N'-tetraarylbenzidine.

The layers can be deposited on a surface of one of the electrodes by spin coating, dip coating, vapor deposition, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

When the electron and hole localize on a nanocrystal, emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. No. 6,322,901, which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide (($TMS)_3P$), tris (trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal outer layers are described in U.S. Pat. No. 6,251,303, which is incorporated by reference in its entirety.

More specifically, the coordinating ligand can have the formula:

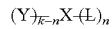

wherein k is 2, 3 or 5, and n is 1, 2, 3, 4 or 5 such that k–n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—; and each of R$^a$ and R$^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, *Advanced Organic Chemistry,* which is incorporated by reference in its entirety.

Layers including nanocrystals can be formed by redispersing the powder semiconductor nanocrystals described above in a solvent system and drop casting films of the nanocrystals from the dispersion. The solvent system for drop casting depends on the chemical character of the outer surface of the nanocrystal, i.e., whether or not the nanocrystal is readily dispersible in the solvent system. The drop cast films are dried in an inert atmosphere for about 12 to 24 hours before being dried under vacuum. Typically, the films are formed on substrates.

Transmission electron microscopy (TEM) can provide information about the size, shape, and distribution of the nanocrystal population. Powder x-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum.

For example, nanocrystals can be dispersed in a N,N'-diphenyl-N,N'-bis(3-methylphenyl)-(1,1'-biphenyl)-4,4'-diamine (TPD) matrix (a hole transport organic layer; HTL) to yield an efficient light emitting device. A dispersion including the nanocrystals in a HTL not only circumvents the relatively poor conduction observed in nanocrystal solids, but can also reduce the number of pinhole shorts in the nanocrystal layer. The dispersion of nanocrystals can form an emissive molecule layer (EML). TPD is a wide band-gap material that can facilitate the hole injection into the low lying nanocrystal valence energy levels and avoid the reabsorption of the nanocrystal emission. Nanocrystals capped with, for example, TOPO, can accept injection of holes, electrons, or excitons. TPD and nanocrystals are both dispersed in a suitable solvent (chloroform in this case); the mixed solution is spin-coated on top of precleaned ITO substrates. A layer of aluminum tris(8-hydroxyquinoline) (Alq$_3$) followed by the metal electrode layers are then deposited via thermal evaporation. The device is grown in a controlled (oxygen-free and moisture-free) environment, preventing the quenching of luminescent efficiency during the fabrication process. The TPD is the HTL while the Alq$_3$ acts as an electron transport layer (ETL). This separation of function allows placement of the hole/electron recombination (e.g., exciton) recombination zone. The Alq$_3$ layer thickness is chosen to separate the hole/electron recombination zone from the metal electrode that would otherwise quench the radiative recombination. Device structures are shown in FIGS. 2A-G. Other multilayer structures may be used to improve the device performance. An electron blocking layer (EBL), a hole blocking layer (HBL) or a hole and electron blocking layer (eBL), can be introduced in the structure as shown, for example, in FIGS. 2C-G. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene. For example, a HBL of BCP can be deposited on top of the TPD-nanocrystal layer followed by the $Alq_3$ and the metal electrode layers in order to block any hole carriers going into the $Alq_3$ layer. This can prohibit any $Alq_3$ emission and improve the spectral purity.

Figure 3:
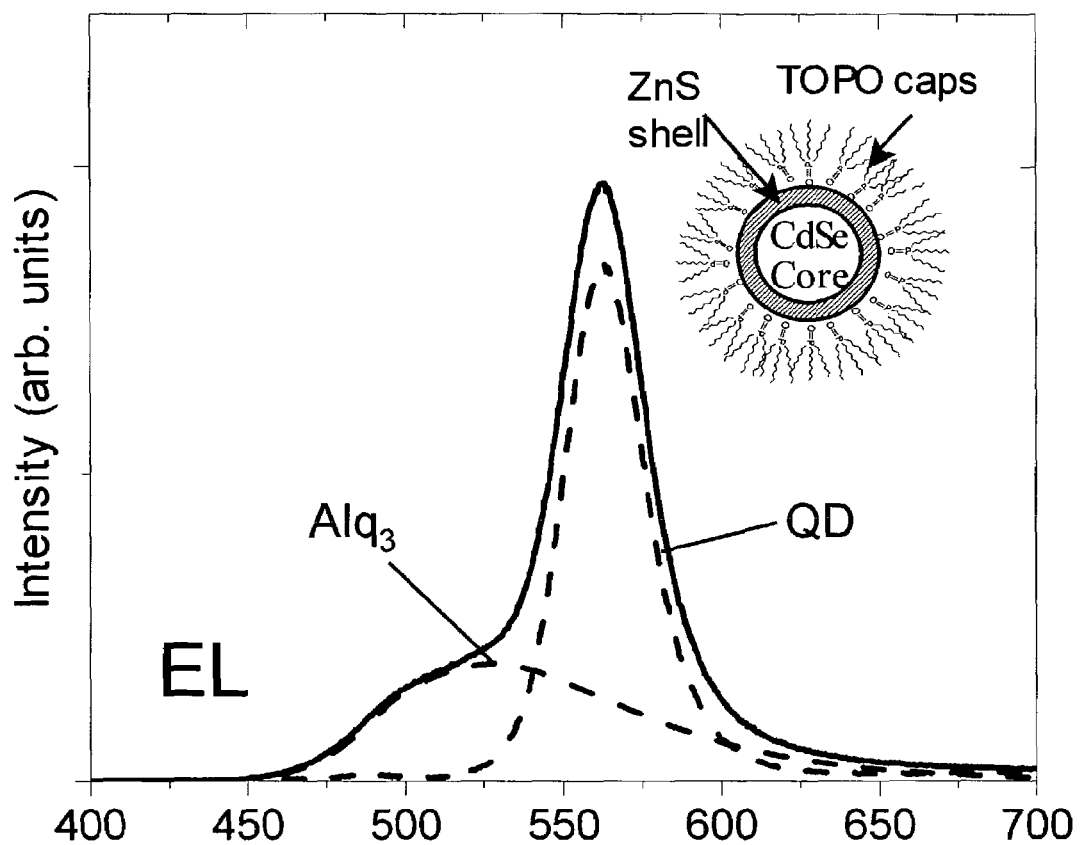
FIG. 3 is a graph depicting an electroluminescence spectrum of a nanocrystal light emitting device.

Two pathways to nanocrystal emission can be realized. Charge can be directly injected into the nanocrystals from the host matrix, resulting in exciton formation and photon emission. Alternatively, an exciton may be created in the organic host matrix and transferred via Forster or Dexter energy transfer directly to the nanocrystal or via a ligand covalently attached to the nanocrystal, which then emits at its characteristic frequency. Once electrons and holes are successfully injected into the nanocrystal, the electron-hole pair (exciton) can recombine radiatively and emit a photon. FIG. 3 shows (a) the emission spectrum and (b) the current dependent efficiency profile obtained from the nanocrystal light emitting devices described above. The spectrum is dominated by the nanocrystal emission mixed with a relatively small $Alq_3$ emission. Reproducible external efficiencies of about 1.0% can be obtained. The turn-on voltage is about 6V for a current density of 0.1 $mA/cm^2$.

The performance of organic light emitting devices can be improved by increasing their efficiency, narrowing or broadening their emission spectra, or polarizing their emission. See, for example, Bulović et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

Nanocrystals of CdSe coated with a ZnS passivation layer can have photoluminescence quantum efficiencies of as high as 50%, matching that of the best organic lumophores. See, for example, Hines et al., J. Phys. Chem. 100, 468 (1996), which is incorporated by reference in its entirety. By changing the diameter of the CdSe core from 23 to 55 Å, the luminescence wavelength can be precisely tuned from 470 nm to 640 nm with a typical spectral full width at half of maximum (FWHM) of less than 40 nm. See, for example, Dabbousi et al., J. Phys. Chem. 101, 9463 (1997), which is incorporated by reference in its entirety. The narrow FWHM of nanocrystals can result in saturated color emission. This can lead to efficient nanocrystal-light emitting devices even in the red and blue parts of the spectrum, since in nanocrystal emitting devices no photons are lost to infrared and UV emission. The broadly tunable, saturated color emission over the entire visible spectrum of a single material system is unmatched by any class of organic chromophores. A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. Furthermore, environmental stability of covalently bonded inorganic nanocrystals suggests that device lifetimes of hybrid organic/inorganic light emitting devices should match or exceed that of all-organic light emitting devices, when nanocrystals are used as luminescent centers. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The excited state lifetime ($\tau$) of the nanocrystal is much shorter ($\tau \approx 10$ ns) than a typical phosphor ($\tau > 0.5$ μs), enabling nanocrystal-light emitting devices to operate efficiently even at high current density.

Devices can be prepared that emit visible or infrared light. The size and material of a semiconductor nanocrystal can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm. For example, a device including PbSe nanocrystals can emit infrared light of wavelengths between 1200 and 2500 nm, for example between 1300 and 1600 nm. More specifically, a device including an HTL of TPD, ~4 nm diameter PbSe nanocrystals with a capping layer of oleic acid, and an ETL of $Alq_3$ can emit light with a wavelength of 1550 nm.

Figure 2A:
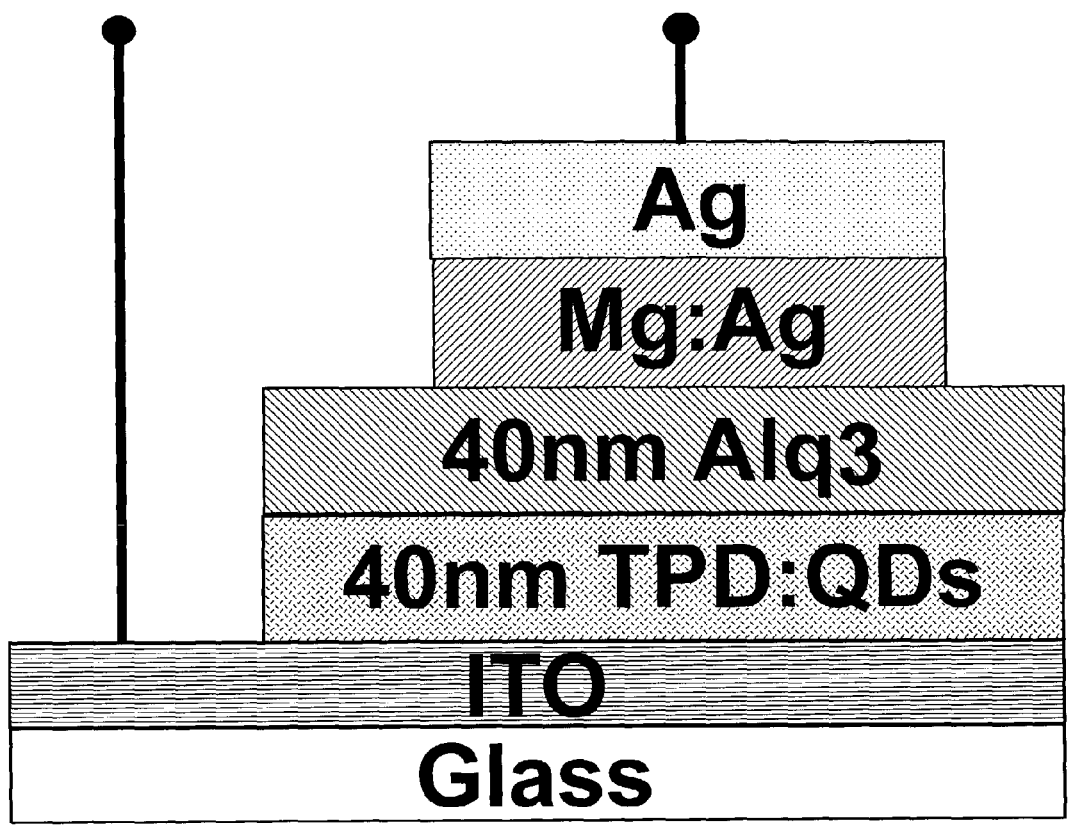
FIGS. 2A-G are schematic drawings depicting light-emitting device structures.

Electrically pumped molecular organic structures including semiconductor nanocrystals can form organic light emitting devices that exhibit efficient electroluminescence. A drawing of a light emitting device is shown in FIG. 2A, along with A schematic drawing of a core-shell type nanocrystal passivated with trioctylphosphine oxide (TOPO) caps is shown in the inset of FIG. 3. The nanocrystal solutions, which can be prepared by the synthetic technique of Murray, et al., J. Am. Chem. Soc. 115, 8706 (1993), which is incorporated by reference in its entirety, have emission spectra that peak at 562 nm, with an absorption maximum at 548 nm. The CdSe core diameter is approximately 38 Å, and is overcoated with 1.5 monolayers of ZnS. The solution photoluminescence efficiency of the nanocrystals used in this device preparation is 30%. By increasing the overcoating thickness from 1 to 6 monolayers, the efficiency of electroluminescence of a 48 Å diameter CdSe core nanocrystal increases by nearly a factor of two, which is greater than the increase in efficiency of photoluminescence of the solutions of the nanocrystals. Thus the transfer of excitons into the emissive semiconductor nanocrystals seems to have increased in tandem with the increased efficiency of emission once the nanocrystal is excited. This result suggests that the dominant nanocrystal excitation mechanism in these devices is exciton energy transfer from neighboring organic molecules. The nanocrystals are mixed in various concentrations into a chloroform solution of N,N'-diphenyl-N,N'-bis (3-methylphenyl)-(1,1'-biphenyl)-4,4'-diamine (TPD), which is then spin-cast onto clean, ITO coated glass substrates, resulting in a 40 nm thick film. A 40 nm thick film of tris(8-hydroxyquinoline) aluminum ($Alq_3$) is then thermally evaporated onto the TPD:nanocrystal layer, and capped by a 1 mm diameter, 75 nm thick (10:1 by mass) Mg:Ag cathode with a 50 nm Ag cap. The spin-casting and device manipulation during growth is performed in a dry nitrogen environment, with moisture and oxygen content of less than 5 ppm. All measurements are done in air.

The choice of organic host for the nanocrystals is limited by material deposition methods. CdSe nanocrystals are typically arranged into thin films by spin-casting from solution. While spin-casting is possible for molecular organics, and typical for polymer organics, it limits the available organic matrix materials to those that are highly soluble in solvents such as toluene, hexanes and chloroform, which are the preferred solvents for the TOPO capped nanocrystal colloids. In order to have a large range of possible solution mixtures and film thicknesses, it is necessary to have organic solubility in the range of 10 mg/mL. Such is the case for TPD in chloroform. TPD has the added advantage of being a blue emitting material, which can facilitate access to the entire visible spectrum by doping different sized nanocrystals into this organic matrix. A typical nanocrystal-light emitting device emission is shown in FIG. 3. The dashed lines show the decomposition of the spectrum into an $Alq_3$ component and a nanocrystal component. Insets show the schematics of the device structure and a core-shell type nanocrystal. The spectral peak at 562 nm is due to the nanocrystals, and the broader shoulder centered at 530 nm, attributable to $Alq_3$ emission. The dashed lines show the decomposition of the electroluminescence spectrum into $Alq_3$ and nanocrystal contributions. The integrated intensity of nanocrystal emission was 60% of the total device luminescence.

Figure 4A:
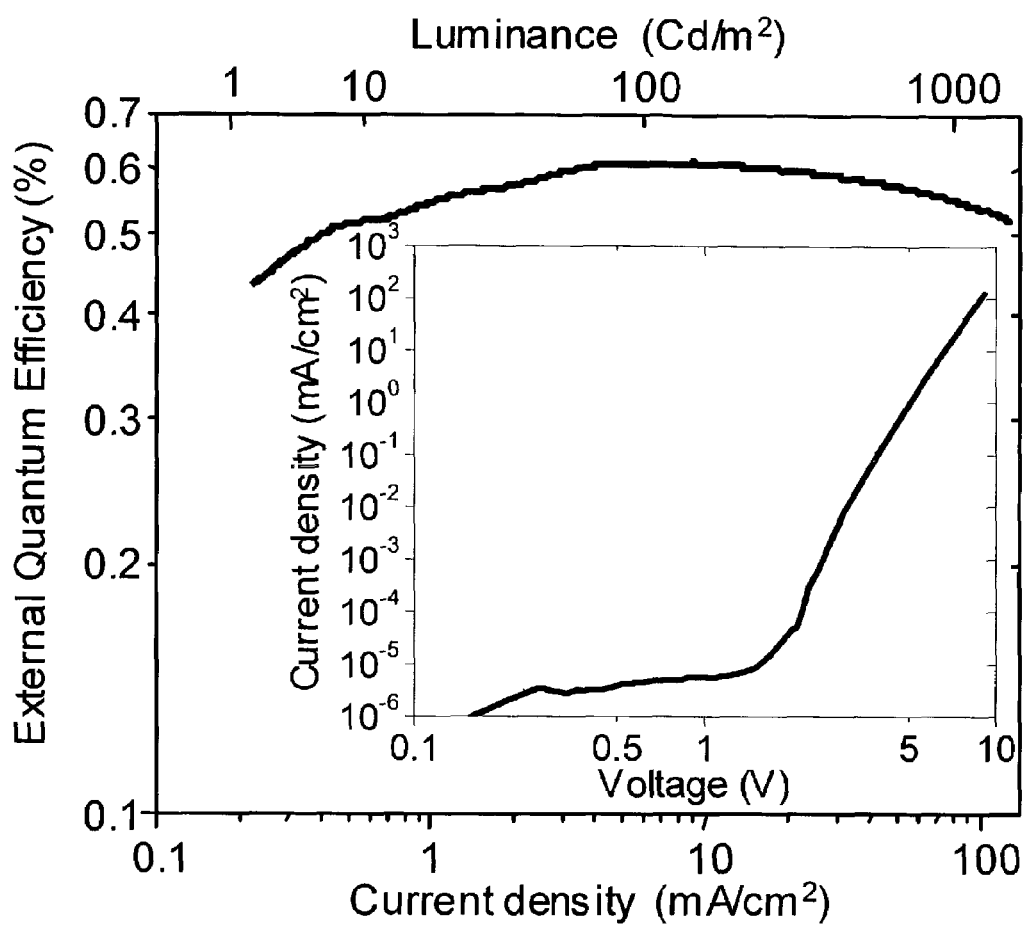
FIGS. 4A-B are a graphs depicting external quantum efficiency and current-voltage plots for nanocrystal light emitting devices.
Figure 4B:
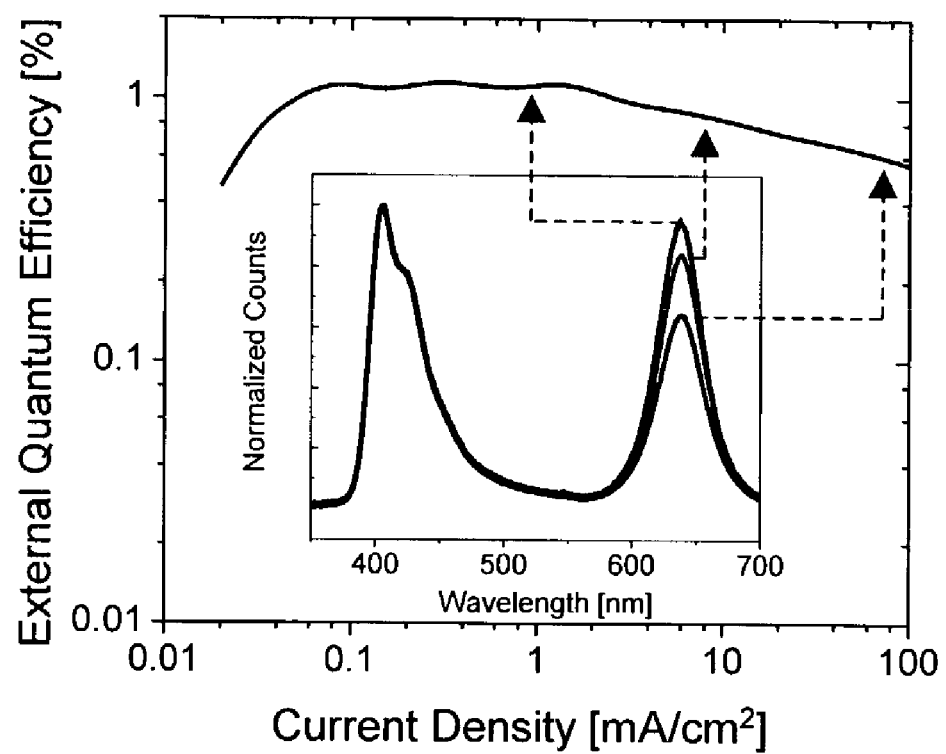

The external quantum efficiency of nanocrystal-light emitting devices as a function of current is shown in FIG. 4. An efficiency of 0.45% is obtained at 7 $mA/cm^2$ and 10.5 V. The quantum efficiency was above 0.5% for a broad range of device luminances (from 5 to 1900 $cd/m^2$). The quantum efficiency was 0.61% at 21 $mA/cm^2$. At 125 $mA/cm^2$, the light emitting device luminance was 1900 $cd/m^2$, which corresponds to a luminescence efficiency of 1.5 cd/A. This is a 25 fold improvement over the best previously reported nanocrystal-light emitting device result. See, for example, Schlamp, et al., J. Appl. Phys. 82, 5837 (1997). The peak external quantum efficiency was above 1.0% between 0.1 and 1.0 $mA/cm^2$. Device yields over hundreds of devices are greater than 90%, indicating a robust material system.

The spectrum and efficiency of nanocrystal-light emitting devices strongly depends on nanocrystal concentration in the TPD matrix. For low concentrations of nanocrystals the device behavior is similar to an undoped structure, and at extremely high nanocrystal concentrations a morphology change in the nanocrystal doped layer is observed that leads to poor device performance and low yields. The thickness of the TPD:nanocrystal layer also plays a critical role in determining the device properties. With a thick TPD:nanocrystal layer, the $Alq_3$ emission is completely suppressed at the expense of lower quantum efficiency and higher turn-on voltage of the device. Thinning this layer leads to an excess of hole injection, and thus enhanced $Alq_3$ emission. An alternative method to eliminating the $Alq_3$ emission without sacrificing efficiency is to use a hole and electron blocking layer such as a triazole between the $Alq_3$ and TPD:nanocrystal layers. The device shows the spectral purity that one would expect, with 90% of the emission being due to the nanocrystals. The peak external quantum efficiency is 1.0% in such a device, which is consistent with two thirds of the emission of the 0.61% efficient devices being due to nanocrystals.

The observed spectra also show a minimal dependence on current density. Deep trap emission from the nanocrystals is always present as a weak electroluminescence tail red-shifted from the main emission peak, but it saturates at very low currents (<1 $mA/cm^2$). This deep trap emission is enhanced when incorporating core only nanocrystals, rather than core-shell type nanocrystals. With the less stable nanocrystals, the deep trap emission saturates at much higher current densities (~100 $mA/cm^2$), resulting in light emitting devices with significant emission in the infrared. For optimum visible light emitting device performance the overcoated nanocrystals can be used.

Figure 5:
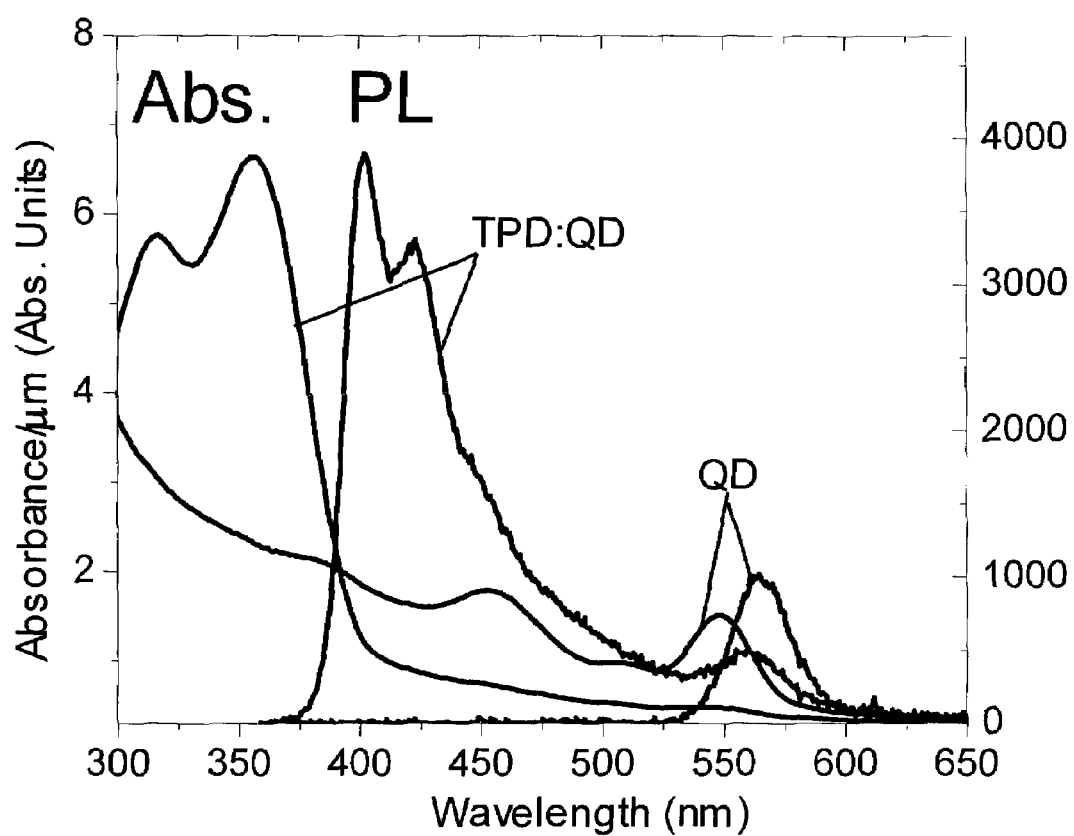
FIG. 5 is a graph depicting photoluminescence spectra of single component films, a host:guest N,N'-diphenyl-N,N'-bis(3-methylphenyl)-(1,1'-biphenyl)-4,4'-diamine:nanocrystal film, and the device in the inset of FIG. 2.

Absorption and photoluminescence measurements of thin films, and electroluminescence from device structures were analyzed. FIG. 5 shows thin film absorption and photoluminescence of neat films of $Alq_3$, TPD, and nanocrystals, along with a nanocrystal doped TPD film (TPD:nanocrystal) spun from the same solution that was used in the device shown in FIG. 2A. Absorption measurements indicated that nanocrystals make up only 5% by volume of the 400 Å films. This corresponds to a layer that is 20 Å thick, which is not possible since the nanocrystals themselves are 50 Å in diameter including the overcoating and organic caps. Thus, the nanocrystals may not be arranged into a complete layer, and can play a limited role in conduction, even if the nanocrystals completely phase segregate from the TPD during the spinning process. A device with a similar structure to that shown in FIG. 2A, but with an additional 50 Å of TPD deposited by thermal evaporation between the spun layer and the $Alq_3$ was prepared. In a simple TPD/$Alq_3$ device, no emission was observed from the TPD. Therefore, it appears that all of the excitons were created within one Forster energy transfer radius (~40 Å) of the $Alq_3$ interface. By adding this 50 Å TPD layer, substantially all of the excitons can be created on organic sites (both TPD and $Alq_3$ are possible sites). The emission spectrum of such a device clearly shows that the nanocrystals still emit (35% of total emission is due to nanocrystals in such a device). There is exciton energy transfer from TPD to nanocrystals in this device. It is also possible that excitons can be created directly on the nanocrystals in the other device structure. These two processes can compete in the different device structures. Photoluminescence spectra are consistent with energy transfer occurring because if it does not, less nanocrystal emission would take place from the nanocrystal:TPD films. The enhancement in nanocrystal emission is consistent with a Forster energy transfer radius of 30 Å for nanocrystals that are 10% quantum efficient in solid state. This solid state quantum efficiency of was determined for a neat film of nanocrystals relative to a neat film of TPD. Variation of the ZnS overcoating thickness can also be made.

Figure 2B:
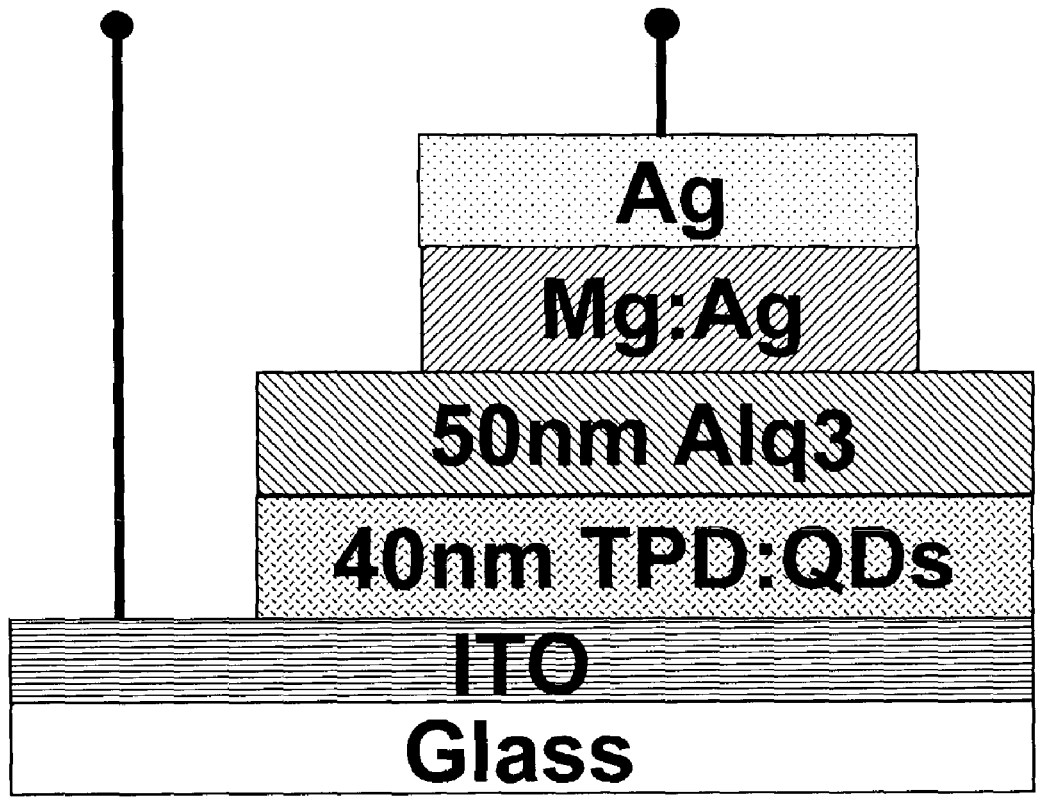
Figure 2C:
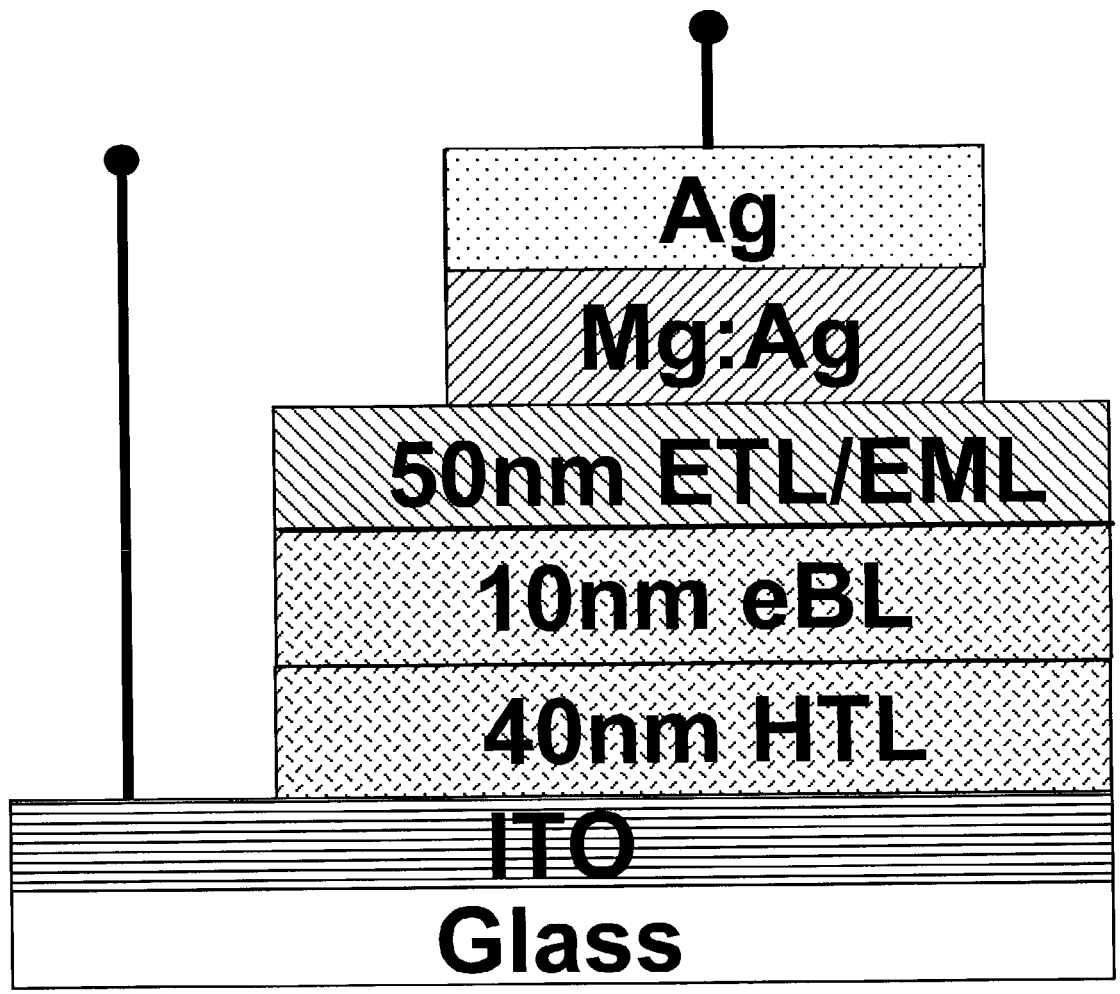
Figure 2D:
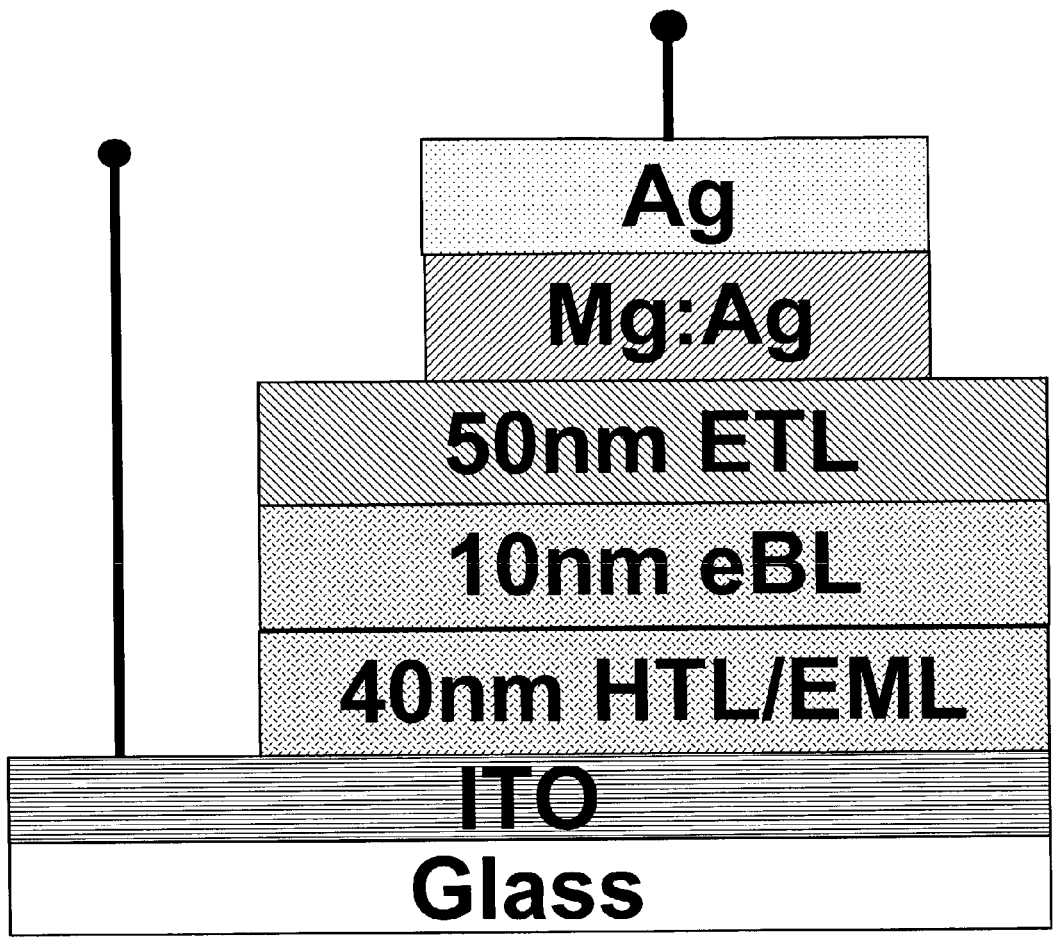
Figure 2E:
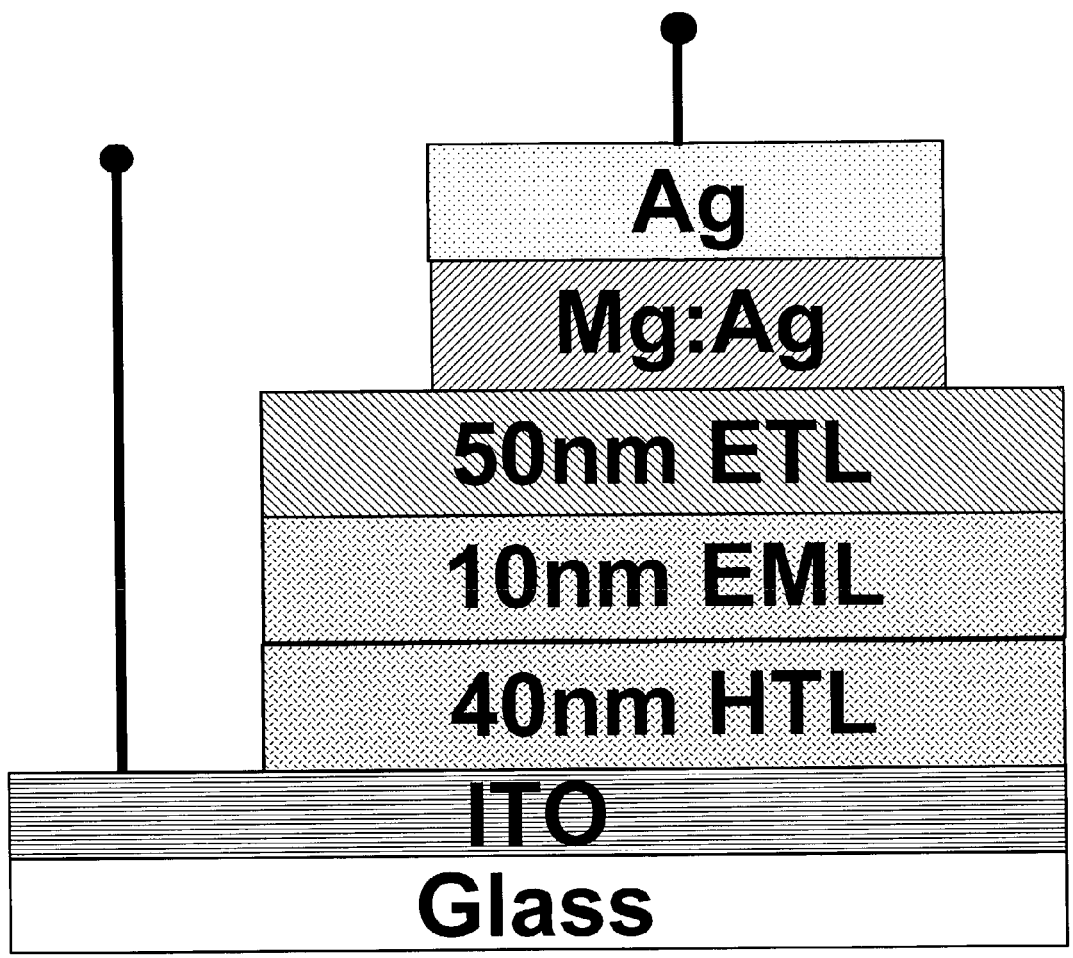
Figure 2F:
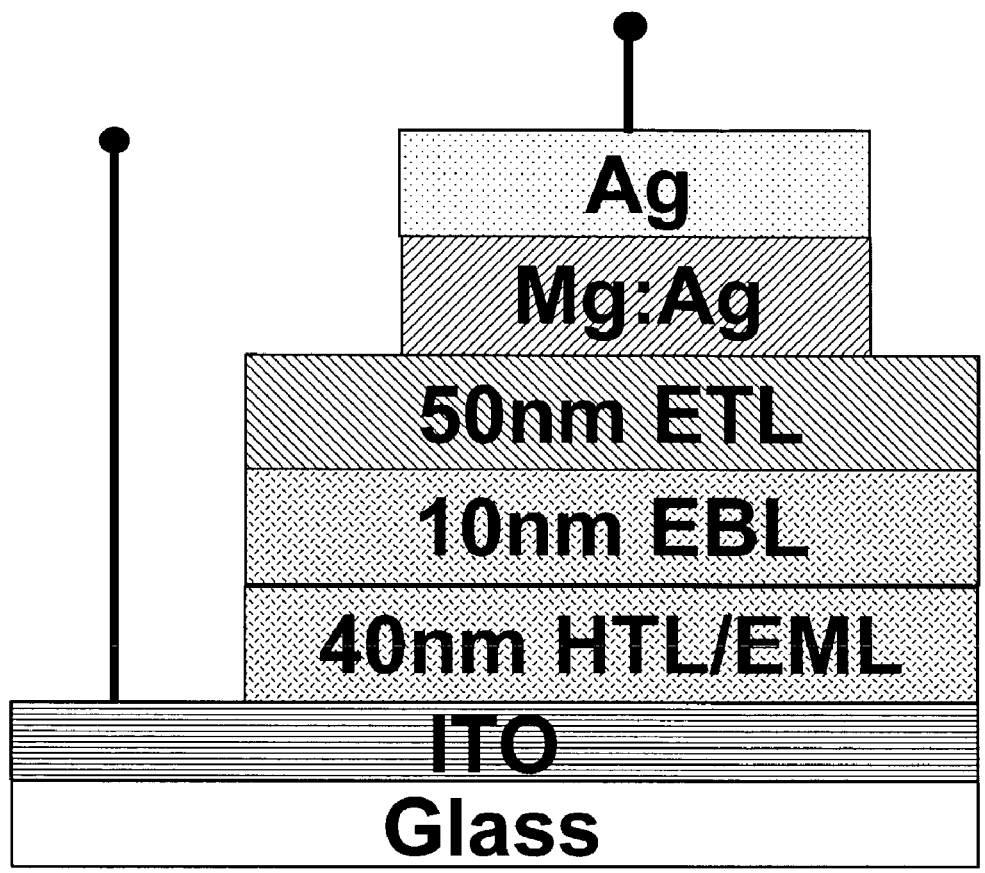
Figure 2G:
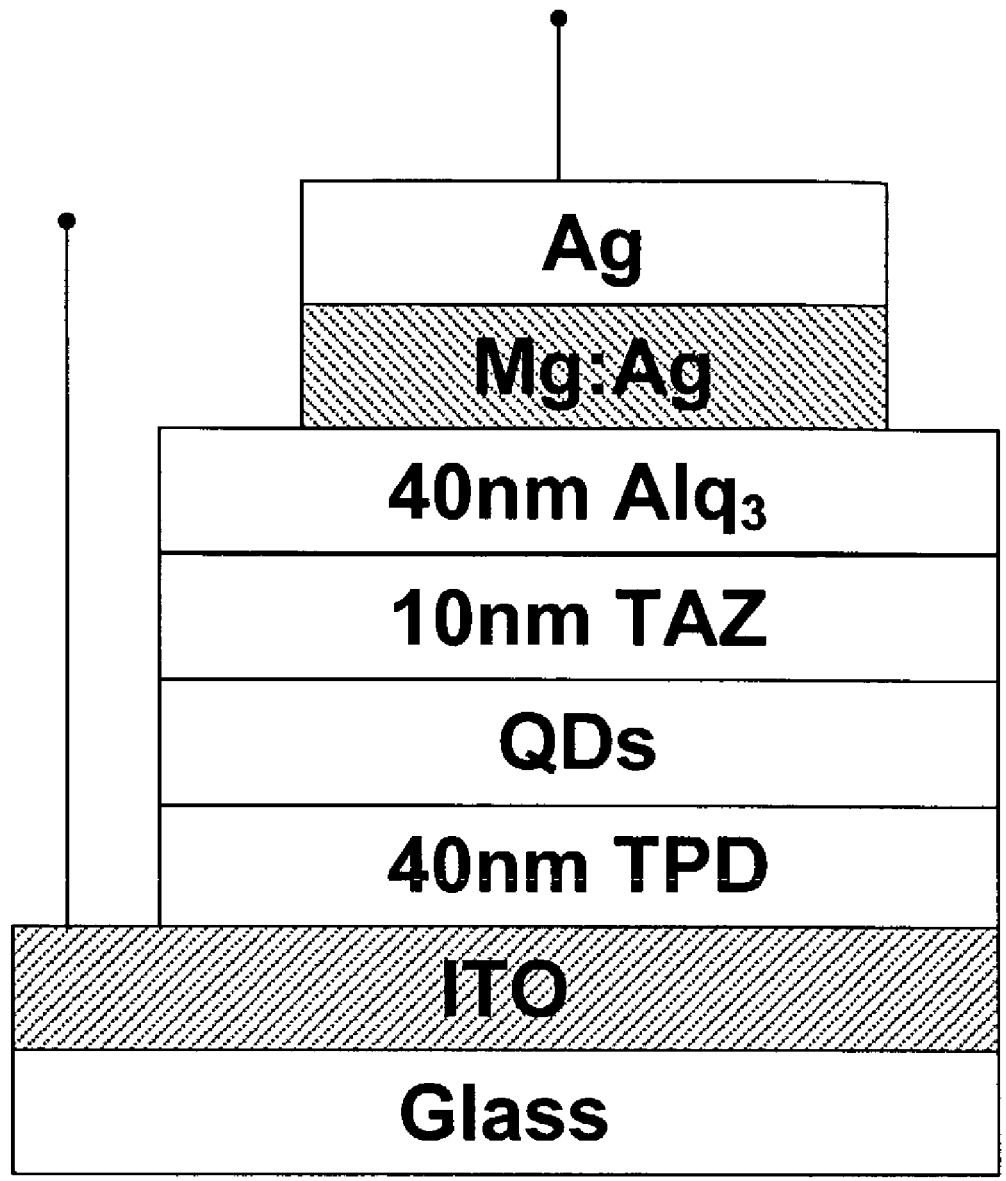
Figure 6:
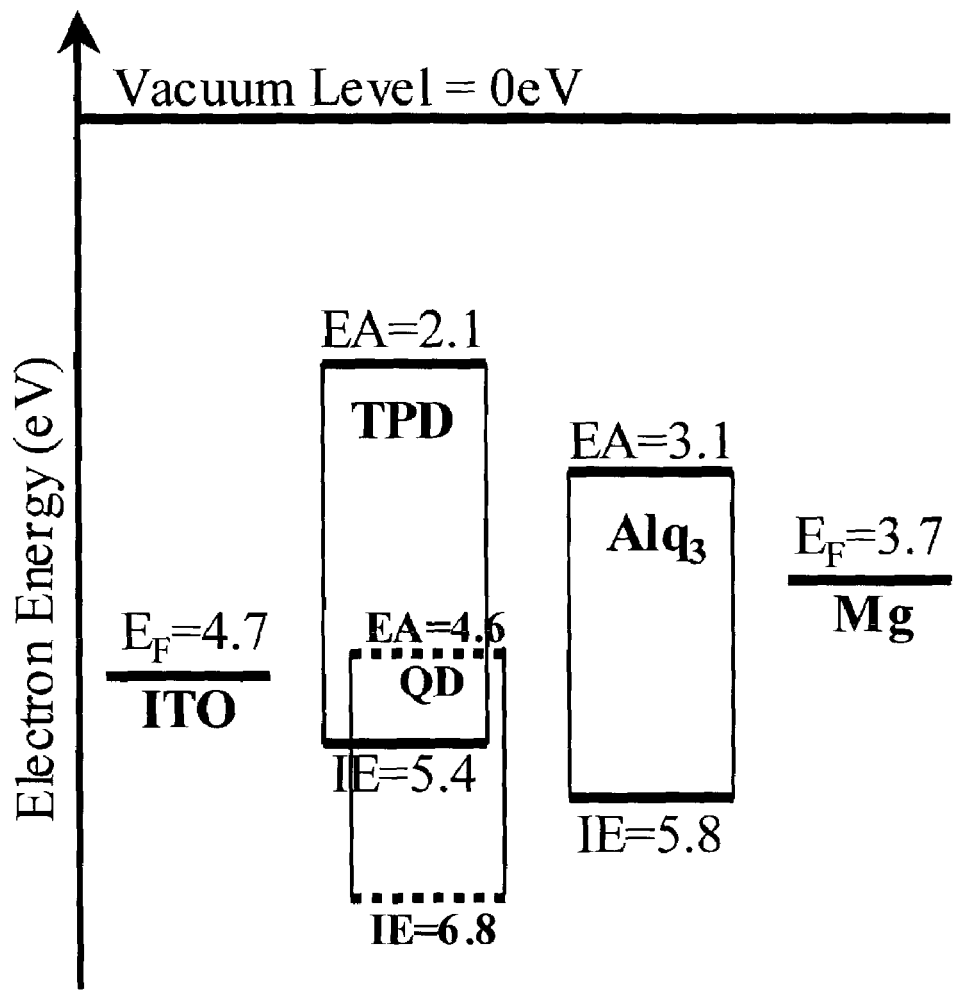
FIG. 6 is a graph depicting a proposed energy level diagram of the device of FIG. 2.

FIG. 6 shows a proposed energy level diagram for the device of FIG. 2B. Where possible, values are taken from ultraviolet photoelectron spectroscopy (UPS) measurements. See, for example, Hill et al., J. Appl. Phys. 86, 4515 (1999), which is incorporated by reference in its entirety. Nanocrystal levels shown are from calculated values. Electrons can be injected from the Mg cathode into the $Alq_3$ and are transported to the heterojunction. Similarly, holes can be injected from the ITO contact primarily into the TPD host matrix, and are transported towards the junction. The relative energy alignment of the lowest unoccupied molecular orbital (LUMO) levels of $Alq_3$ and the nanocrystals results in electrons trapped at the nanocrystals that are located near this heterojunction. For these charged nanocrystals the barrier to hole injection from the TPD is greatly reduced. Upon acceptance of holes from TPD, excitons form on the nanocrystals, and can subsequently recombine radiatively. The spectrum in FIG. 3 indicates that a fraction of excitons are formed on the $Alq_3$ molecules, contributing to the emission of green light. However, TPD electroluminescence was not observed in this device structure, indicating that excitons that are formed on TPD either undergo energy transfer to $Alq_3$, or recombine nonradiatively.

The charge trapping mechanism allows for the creation of excitons on the nanocrystals which can exist in any of the eight-fold degenerate exciton states, all of which may recombine to emit a photon. See, for example, Kuno et al., J. Chem. Phys. 106, 9869 (1997), which is incorporated by reference in its entirety. This is in direct contrast to organic fluorescent lumophores where only one in four electrically generated excitons can recombine radiatively. See, for example, Baldo et al., Nature, 395, 151 (1998), which is incorporated by reference in its entirety. However, there are other inherent limits to the quantum efficiency of any device utilizing nanocrystals as the emitting centers. Besides the unoptimized initial nanocrystal photoluminescence efficiency (in the devices $\eta \approx 30\%$), it has previously been reported that an exciton located on a charged nanocrystal is not likely to radiatively recombine. See, for example, Shimazu et al., Phys. Rev. B, 63, 205316-1 (2001), which is incorporated by reference in its entirety. Following an Auger recombination process, the energy of the exciton is given to the second excited electron on the nanocrystal, which could lead to the ejection of the second electron from the nanocrystal or its non-radiative recombination. To achieve high external quantum efficiencies it is therefore necessary to optimize charge injection balance in nanocrystal-light emitting devices, or to eliminate charge injection excitons as a possibility.

The fundamental limits of nanocrystal-light emitting device performance can be significantly different than those of organic light emitting devices. The nanocrystal-light emitting devices have an emission FWHM of 31 nm. In contrast, typical molecular organic light emitting devices have a FWHM of between 60 and 100 nm, although emission of some polymers and phosphorescent molecules was shown to be as narrow as 26 nm FWHM. See, for example, Liu et al., Appl. Phys. Lett. 79, 578 (2001), and Kwong et al., Chem. Mat. 11, 3709 (1999), each of which is incorporated by reference in its entirety. However, in all of these cases the fundamental limit on bandwidth has already been achieved through materials preparation and purification. The vibrational structure of sterically flexible organics typically generates broad single molecule emission spectra at room temperature. See, for example, Tamarat et al., J. Phys. Chem. A 104, 1 (2000), which is incorporated by reference in its entirety. The same is not true of the rigid, covalently bonded inorganic nanocrystal, for which single nanocrystal spectroscopy shows that the fundamental FWHM linewidth of a nanocrystal at room temperature is 14 nm. See, for example, Empedocles et al., Phys. Rev. Lett. 77, 3873 (1996), which is incorporated by reference in its entirety. It is the combination of spectral diffusion and size distribution of nanocrystals in a sample that yields further line broadening. Consequently, the 31 nm linewidth corresponds to a size distribution of about 10%. It is reasonable to expect that new techniques in nanocrystal preparation and processing could lead to nanocrystal-light emitting device line widths that are as narrow as 25 nm. This true color saturation would be ideal for many applications where efficient production of narrowband light is desired. In particular, the creation of a high luminescent efficiency red light emitting device can require both high external quantum efficiency as well as narrowband emission, to prevent the bulk of emission from occurring in the infrared. The deep trap emission that is typical of nanocrystals could be problematic in achieving this goal, but the devices reported here already show less than 1% of their total power emitted in the infrared. This deep trap emission saturates at very low current densities. See, for example, Kuno et al., J. Chem. Phys. 106, 9869 (1997). The spectral FWHM reported here is already an improvement over conventional organic light emitting devices, and yet the fundamental limit has not been attained.

A high efficiency light emitting device utilizes molecular organic thin films as the electrical transport medium and inorganic CdSe(ZnS) nanocrystals as the lumophores. These devices represent a twenty-five-fold improvement in luminescent power efficiency over previously reported nanocrystal-light emitting devices. The mechanism for light emission is shown to be carrier recombination on the nanocrystals. It is clear that the limit of device performance has not yet been reached, both in quantum efficiency and in color saturation. Development of new deposition techniques for generating homogeneously dispersed films of nanocrystals in organic matrices should make possible a much wider range of material hybrids, enabling the creation of light emitters that are technologically competitive with state of the art organic and inorganic light emitting devices.

Other embodiments are within the scope of the following claims.

What is claimed is:
1. A light emitting device comprising:
a first electrode;
a hole transporting layer proximate to the first electrode;
a second electrode opposed to the first electrode;
an electron transporting layer between the hole transporting layer and the second electrode, wherein the second electrode is arranged to introduce electrons in the electron transporting layer; and
a layer including a matrix and a plurality of semiconductor nanocrystals disposed between the first electrode and the second electrode, wherein the plurality of semiconductor nanocrystals is dispersed in the matrix and includes a substantially monodisperse population of semiconductor nanocrystals with an rms deviation in diameter of less than 15% and distinguishable from any other population of semiconductor nanocrystals based on emission characteristics; and wherein the layer including a plurality of semiconductor nanocrystals is distinct from the electron transporting layer, wherein each semiconductor nanocrystal includes a coordinating ligand on the surface of the semiconductor nanocrystal.

2. The device of claim 1, wherein the matrix is non-polymeric.

3. The device of claim 1, wherein the matrix includes an organic chromophore.

4. The device of claim 1, wherein the plurality of semiconductor nanocrystals includes more than one substantially monodisperse population of semiconductor nanocrystals, each population distinguishable from each other population based on emission characteristics.

5. The device of claim 1, wherein the plurality of semiconductor nanocrystals emit light of a wavelength between 300 nm and 400 nm.

6. The device of claim 1, wherein the plurality of semiconductor nanocrystals emit light of a wavelength between 400 nm and 700 nm.

7. The device of claim 1, wherein the plurality of semiconductor nanocrystals emit light of a wavelength between 700 nm and 1100 nm.

8. The device of claim 1, wherein the plurality of semiconductor nanocrystals emit light of a wavelength between 1100 nm and 2500 nm.

9. The device of claim 1, wherein the plurality of semiconductor nanocrystals emit light of a wavelength of 2500 nm or greater.

10. The device of claim 1, wherein the coordinating ligand has the formula

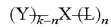

wherein k is 2, 3 or 5, and n is 1, 2, 3, 4 or 5 such that k−n is not less than zero; X is O, S, S=O, SO$_2$, Se, Se=O, N, N=O, P, P=O, As, or As=O;

each of Y and L, independently, is aryl, heteroaryl, or a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by —O—, —S—, —N(R$^a$)—, —N(R$^b$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—; and each of R$^a$ and R$^b$, independently, is hydrogen, alkyl, alkenyl, alkynyl, alkoxy, hydroxylalkyl, hydroxyl, or haloalkyl.

11. The device of claim 1, wherein the layer including a matrix is a hole transporting layer.

12. The device of claim 11, further comprising an electron blocking layer between the hole transporting layer and the electron transporting layer.

13. The device of claim 11, further comprising a hole blocking layer between the hole transporting layer and the electron transporting layer.

14. The device of claim 11, further comprising a hole and electron blocking layer between the hole transporting layer and the electron transporting layer.

15. The device of claim 1, wherein the semiconductor nanocrystals comprise at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

16. The device of claim 15, wherein the semiconductor nanocrystals further comprise an overcoating, the overcoating comprising at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

17. A light emitting device comprising:
a hole transporting layer in contact with a first electrode arranged to introduce holes in the hole transporting layer;
an electron transporting layer in contact with a second electrode arranged to introduce electrons in the electron transporting layer; and
a layer including a matrix and a plurality of semiconductor nanocrystals disposed between the first electrode and the second electrode, wherein the plurality of semiconductor nanocrystals is dispersed in the matrix and includes a substantially monodisperse population of semiconductor nanocrystals with an rms deviation in diameter of less than 15% and distinguishable from any other population of semiconductor nanocrystals based on emission characteristics; and wherein the layer including a plurality of semiconductor nanocrystals is distinct from the electron transporting layer, wherein each semiconductor nanocrystal includes a coordinating ligand on the surface of the semiconductor nanocrystal.

18. The device of claim 17, wherein the matrix includes an organic chromophore.

19. The device of claim 17, wherein the hole transporting layer includes a non-polymeric matrix.

20. The device of claim 17, wherein the plurality of semiconductor nanocrystals includes more than one substantially monodisperse population of semiconductor nanocrystals, each population distinguishable from each other population based on emission characteristics.

21. The device of claim 17, wherein the plurality of semiconductor nanocrystals emit light of a wavelength between 300 nm and 400 nm.

22. The device of claim 17, wherein the plurality of semiconductor nanocrystals emit light of a wavelength between 400 nm and 700 nm.

23. The device of claim 17, wherein the plurality of semiconductor nanocrystals emit light of a wavelength between 700 nm and 1100 nm.

24. The device of claim 17, wherein the plurality of semiconductor nanocrystals emit light of a wavelength between 1100 nm and 2500 nm.

25. The device of claim 17, wherein the plurality of semiconductor nanocrystals emit light of a wavelength of 2500 nm or greater.

26. The device of claim 17, wherein the coordinating ligand has the formula

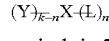

wherein k is 2, 3 or 5, and n is 1, 2, 3, 4 or 5 such that k−n is not less than zero; X is O, S, S=O, SO$_2$, Se, Se=O, N, N=O, P, P=O, As, or As=O;

each of Y and L, independently, is aryl, heteroaryl, or a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by —O—, —S—, —N(R$^a$)—, —N(R$^b$)—C(O)—O—, —O—C(O)—N(R$^a$)—, —N(R$^a$)—C(O)—N(R )—, —O—C(O)—O—, —P(R$^a$)—, or —P(O)(R$^a$)—; and each of R$^a$ and R$^b$, independently, is hydrogen, alkyl, alkenyl, alkynyl, alkoxy, hydroxylalkyl, hydroxyl, or haloalkyl.

27. The device of claim 17, further comprising an electron blocking layer between the hole transporting layer and the electron transporting layer.

28. The device of claim 17, further comprising a hole blocking layer between the hole transporting layer and the electron transporting layer.

29. The device of claim 17, further comprising a hole and electron blocking layer between the hole transporting layer and the electron transporting layer.

30. The device of claim 17, wherein the semiconductor nanocrystals comprise at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

31. The device of claim 30, wherein the semiconductor nanocrystals further comprise an overcoating, the overcoating comprising at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

32. A light emitting device comprising:
a hole transporting layer proximate to a first electrode arranged to introduce holes in the hole transporting layer;
an electron transporting layer proximate to a second electrode arranged to introduce electrons in the electron transporting layer;
a layer including a matrix and a plurality of semiconductor nanocrystals disposed between the first electrode and the second electrode, wherein the plurality of semiconductor nanocrystals is dispersed in the matrix and includes a substantially monodisperse population of semiconductor nanocrystals with an rms deviation in diameter of less than 15% and distinguishable from any other population of semiconductor nanocrystals based on emission characteristics; and wherein the layer including a plurality of semiconductor nanocrystals is distinct from the electron transporting layer, wherein each semiconductor nanocrystal includes a coordinating ligand on the surface of the semiconductor nanocrystal; and
a blocking layer between the first electrode and the second electrode.

33. The device of claim 32, wherein the blocking layer is a hole blocking layer, an electron blocking layer, or a hole and electron blocking layer.

34. The device of claim 33, wherein the blocking layer is in contact with the first electrode or the second electrode.

35. The device of claim 32, wherein the plurality of semiconductor nanocrystals includes more than one substantially monodisperse population of semiconductor nanocrystals, each population distinguishable from each other population based on emission characteristics.

36. The device of claim 32, wherein the plurality of semiconductor nanocrystals emit light of a wavelength between 300 nm and 400 nm.

37. The device of claim 32, wherein the plurality of semiconductor nanocrystals emit light of a wavelength between 400 nm and 700 nm.

38. The device of claim 32, wherein the plurality of semiconductor nanocrystals emit light of a wavelength between 700 nm and 1100 nm.

39. The device of claim 32, wherein the plurality of semiconductor nanocrystals emit light of a wavelength between 1100 nm and 2500 nm.

40. The device of claim 32, wherein the plurality of semiconductor nanocrystals emit light of a wavelength of 2500 nm or greater.

41. The device of claim 32, wherein the hole transporting layer includes TPD, the electron transporting layer includes Alq$_3$, and the blocking layer includes TAZ and is disposed between the semiconductor nanocrystals and the electron transporting layer.

42. A method of manufacturing a light emitting device comprising:
depositing a layer including a matrix and a plurality of semiconductor nanocrystals over a first electrode, wherein the plurality of semiconductor nanocrystals is dispersed in the matrix and includes a substantially monodisperse population of semiconductor nanocrystals with an rms deviation in diameter of less than 15% and distinguishable from any other population of semiconductor nanocrystals based on emission characteristics; and
placing a second electrode over the plurality of semiconductor nanocrystals, wherein an electron transporting layer is proximate to the second electrode, and wherein the layer including a plurality of semiconductor nanocrystals is distinct from the electron transporting layer, wherein each semiconductor nanocrystal includes a coordinating ligand on the surface of the semiconductor nanocrystal.

43. The method of claim 42, wherein the matrix is non-polymeric.

44. The method of claim 42, wherein the matrix includes an organic chromophore.

45. The method of claim 42, wherein providing the plurality of semiconductor nanocrystals includes selecting a substantially monodisperse population of semiconductor nanocrystals to select a wavelength of light to be emitted by the device.

46. The method of claim 42, wherein providing the plurality of semiconductor nanocrystals includes selecting more than one substantially monodisperse population of semiconductor nanocrystals to select more than one wavelength of light to be emitted by the device.

47. The method of claim 42, wherein the coordinating ligand has the formula $$(Y)_{k-n}X(L)_n$$

wherein k is 2, 3 or 5, and n is 1, 2, 3, 4 or 5 such that k-n is not less than zero; X is O, S, S=O, SO$_2$, Se, Se=O, N, N=O, P, P=O, As, or As=O;
each of Y and L, independently, is aryl, heteroaryl, or a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by —O—, —S—, —N(R$^a$)—, —N(R$^b$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—; and
each of R$^a$ and R$^b$, independently, is hydrogen, alkyl, alkenyl, alkynyl, alkoxy, hydroxylalkyl, hydroxyl, or haloalkyl.

48. The method of claim 42, wherein depositing the matrix to form a layer includes forming a hole transporting layer.

49. The method of claim 48, further comprising depositing an electron transporting layer between the hole transporting layer and the second electrode.

50. The method of claim 49, further comprising depositing an electron blocking layer between the hole transporting layer and the electron transporting layer.

51. The method of claim 49, further comprising depositing a hole blocking layer between the hole transporting layer and the electron transporting layer.

52. The method of claim 49, further comprising depositing a hole and electron blocking layer between the hole transporting layer and the electron transporting layer.

53. The method of claim 42, wherein the semiconductor nanocrystals comprise at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

54. The method of claim 53, wherein the semiconductor nanocrystals further comprise an overcoating, the overcoating comprising at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

55. A method of generating light comprising:
providing a device including a first electrode, a second electrode, a layer including a matrix and a plurality of semiconductor nanocrystals disposed between the first electrode and the second electrode, and an electron transporting layer proximate to the second electrode, wherein the plurality of semiconductor nanocrystals is dispersed in the matrix and includes a substantially monodisperse population of semiconductor nanocrystals with an rms deviation in diameter of less than 15% and distinguishable from any other population of semiconductor nanocrystals based on emission characteristics; and wherein the layer including a plurality of semiconductor nanocrystals is distinct from the electron transporting layer, wherein each semiconductor nanocrystal includes a coordinating ligand on the surface of the semiconductor nanocrystal; and
applying a light-generating potential across the first electrode and the second electrode.

56. The method of claim 55, wherein the matrix is non-polymeric.

57. The method of claim 55, wherein the matrix includes an organic chromophore.

58. The method of claim 55, wherein providing the device includes selecting a substantially monodisperse population of semiconductor nanocrystals to select the wavelength of light to be generated.

59. The method of claim 55, wherein providing the device includes selecting more than one substantially monodisperse population of semiconductor nanocrystals to select more than one wavelength of light to be generated.

60. The method of claim 55, wherein light is generated with a wavelength of between 300 nm and 400 nm.

61. The method of claim 55, wherein light is generated with a wavelength of between 400 nm and 700 nm.

62. The method of claim 55, wherein light is generated with a wavelength of between 700 nm and 1100 nm.

63. The method of claim 55, wherein light is generated with a wavelength of between 1100 nm and 2500 nm.

64. The method of claim 55, wherein light is generated with a wavelength of 2500 nm or greater.

65. The method of claim 55, wherein the coordinating ligand has the formula

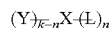

wherein k is 2, 3 or 5, and n is 1, 2, 3, 4 or 5 such that k-n is not less than zero; X is O, S, S=O, $SO_2$, Se, Se=O, N, N=O, P, P=O, As, or As=O;
each of Y and L, independently, is aryl, heteroaryl, or a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by —O—, —S—, —N($R^a$)—, —N($R^b$)—C(O)—O—, —O—C(O)—N($R^a$)—, —N($R^a$)—C(O)—N($R^b$)—, —O—C(O)—O—, —P($R^a$)—, or —P(O)($R^a$)—; and
each of $R^a$ and $R^b$, independently, is hydrogen, alkyl, alkenyl, alkynyl, alkoxy, hydroxylalkyl, hydroxyl, or haloalkyl.

66. The method of claim 55, wherein the layer including a matrix is a hole transporting layer.

67. The method of claim 66, wherein providing the device includes a device wherein the electron transporting layer is disposed between the second electrode and the hole transporting layer.

68. The method of claim 67, wherein providing the device includes a device with an electron blocking layer between the hole transporting layer and the electron transporting layer.

69. The method of claim 67, wherein providing the device includes a device with a hole blocking layer between the hole transporting layer and the electron transporting layer.

70. The method of claim 67, wherein providing the device includes a device with a hole and electron blocking layer between the hole transporting layer and the electron transporting layer.

71. The method of claim 55, wherein the semiconductor nanocrystals comprise at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

72. The method of claim 71, wherein the semiconductor nanocrystals further comprise an overcoating, the overcoating comprising at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

73. The method of claim 55, wherein at least 10% of light emitted is emitted by the semiconductor nanocrystals.

74. The method of claim 55, wherein light is generated from the substantially monodisperse population of semiconductor nanocrystals with a full width at half max of 40 nm or less.

75. The method of claim 55, wherein light is generated from the substantially monodisperse population of semiconductor nanocrystals with a full width at half max of 30 nm or less.

76. The method of claim 55, wherein light is generated with an external quantum efficiency of 0.1% or greater, up to about 1%.

77. The method of claim 55, wherein light is generated with an external quantum efficiency of about 1.0%.

* * * * *

UNITED STATES PATENT AND TRADEMARK OFFICE
CERTIFICATE OF CORRECTION

| | | |
|---|---|---|
| PATENT NO. | : 7,700,200 B2 | Page 1 of 1 |
| APPLICATION NO. | : 10/400908 | |
| DATED | : April 20, 2010 | |
| INVENTOR(S) | : Bulovic et al. | |

It is certified that error appears in the above-identified patent and that said Letters Patent is hereby corrected as shown below:

In the section FEDERALLY SPONSORED RESEARCH OR DEVELOPMENT, the text "The U.S. Government may have certain rights in this invention pursuant to Grant No. DMR-9808941 awarded by the National Science Foundation." should read -- This invention was made with Government support under Grant No. DMR9808941 awarded by the National Science Foundation. The Government has certain rights in this invention. --

Signed and Sealed this

Seventeenth Day of May, 2011

David J. Kappos
*Director of the United States Patent and Trademark Office*